US006924197B2

(12) United States Patent
Weimer

(10) Patent No.: US 6,924,197 B2
(45) Date of Patent: Aug. 2, 2005

(54) METHOD OF FABRICATING AN INTEGRATED CIRCUIT WITH A DIELECTRIC LAYER EXPOSED TO A HYDROGEN-BEARING NITROGEN SOURCE

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 10/378,568

(22) Filed: Mar. 3, 2003

(65) Prior Publication Data

US 2003/0157769 A1 Aug. 21, 2003

Related U.S. Application Data

(62) Division of application No. 09/544,505, filed on Apr. 6, 2000, now Pat. No. 6,559,007.

(51) Int. Cl.[7] .......................................... H01L 21/336
(52) U.S. Cl. ..................... 438/257; 438/263; 438/264; 438/265; 438/266; 438/287; 438/258; 438/259; 257/317; 257/321; 257/626; 257/629; 257/638; 257/639
(58) Field of Search ................................ 438/257, 263, 438/264, 265, 266, 287, 258, 259, 596, 595; 257/317, 321, 626, 629, 638, 639

(56) References Cited

U.S. PATENT DOCUMENTS

| 4,142,004 A | 2/1979 | Hauser, Jr. et al. |
|---|---|---|
| 4,551,231 A | 11/1985 | Kovach et al. |
| 4,623,912 A | 11/1986 | Chang et al. |
| 4,814,292 A | 3/1989 | Sasaki et al. |
| 4,872,043 A | 10/1989 | Fujii |
| 5,102,832 A | 4/1992 | Tuttle |
| 5,112,773 A | 5/1992 | Tuttle |
| 5,159,430 A | 10/1992 | Manning et al. |

(Continued)

OTHER PUBLICATIONS

Cheng et al., Effects of NH$_3$ Plasma Passivation on N–Channel Polycrystalline Silicon Thin–Film Transistors, IEEE, vol. 44, No. 1, pp. 64–68, Jan. 1997.
U.S. Appl. No. 10/377,495 entitled "Ammonia Gas Passivation on Nitride Encapsulated Devices" in 28 pages with 5 sheets of drawings.
U.S. Appl. No. 10/012,665 entitled "Ammonia Gas Passivation on Nitride Encapsulated Devices" in 21 pages with 5 sheets of drawings.
Intel Corporation, *Intel StratFlash™ Memory Development and Implementation*, http://www.chips.com/technology/itj/g41997/articles/art_2b.htm, Dec. 9, 1999; pp. 1–5.
Chevalier, *Electroless Gold Plating*, Plating and Electroplating, pp. 323–325.

(Continued)

*Primary Examiner*—David Nelms
*Assistant Examiner*—Renee R. Berry
(74) *Attorney, Agent, or Firm*—Knobbe, Martens, Olson & Bear, LLP

(57) ABSTRACT

The present invention provides a flash memory integrated circuit and a method of fabricating the same. A tunnel dielectric in an erasable programmable read only memory (EPROM) device is nitrided with a hydrogen-bearing compound, particularly ammonia. Hydrogen is thus incorporated into the tunnel dielectric, along with nitrogen. The gate stack is etched and completed, including protective sidewall spacers and dielectric cap, and the stack lined with a barrier to hydroxyl and hydrogen species. Though the liner advantageously reduces impurity diffusion through to the tunnel dielectric and substrate interface, it also reduces hydrogen diffusion in any subsequent hydrogen anneal. Hydrogen is provided to the tunnel dielectric, however, in the prior exposure to ammonia.

22 Claims, 2 Drawing Sheets

U.S. PATENT DOCUMENTS

| | | | |
|---|---|---|---|
| 5,264,724 A | 11/1993 | Brown et al. | |
| 5,288,527 A | 2/1994 | Jousse et al. | |
| 5,352,330 A | 10/1994 | Wallace | |
| 5,366,917 A | 11/1994 | Watanabe et al. | |
| 5,385,863 A | 1/1995 | Tatsumi | |
| 5,397,720 A | 3/1995 | Kwong et al. | |
| 5,445,999 A | 8/1995 | Thakur et al. | |
| 5,489,542 A | 2/1996 | Iwai et al. | |
| 5,707,746 A | 1/1998 | Yaoi et al. | |
| 5,707,898 A | 1/1998 | Keller et al. | |
| 5,711,998 A | 1/1998 | Shufflebotham | |
| 5,821,603 A | 10/1998 | Puntambekar | |
| 5,880,008 A | 3/1999 | Akiyama et al. | |
| 5,904,860 A | 5/1999 | Nagakubo et al. | |
| 5,936,291 A | 8/1999 | Makita et al. | |
| 5,946,542 A | 8/1999 | Iyer | |
| 5,972,765 A | 10/1999 | Clark et al. | |
| 5,972,804 A | 10/1999 | Tobin et al. | |
| 6,013,310 A | 1/2000 | Yaoi et al. | |
| 6,017,784 A | 1/2000 | Ohta et al. | |
| 6,017,808 A | 1/2000 | Wang et al. | |
| 6,025,281 A | 2/2000 | Passlack et al. | |
| 6,048,795 A | 4/2000 | Numasawa et al. | |
| 6,060,954 A * | 5/2000 | Liu et al. | 331/99 |
| 6,087,206 A | 7/2000 | Hamada | |
| 6,136,641 A | 10/2000 | Won et al. | |
| 6,143,608 A | 11/2000 | He et al. | |
| 6,147,014 A | 11/2000 | Lyding et al. | |
| 6,150,725 A | 11/2000 | Misawa et al. | |
| 6,197,701 B1 | 3/2001 | Shue et al. | |
| 6,204,203 B1 | 3/2001 | Narwankar et al. | |
| 6,218,720 B1 * | 4/2001 | Gardner et al. | 257/510 |
| 6,248,673 B1 | 6/2001 | Huang et al. | |
| 6,251,726 B1 | 6/2001 | Huang | |
| 6,255,230 B1 | 7/2001 | Ikakura et al. | |
| 6,258,730 B1 | 7/2001 | Sun et al. | |
| 6,265,327 B1 | 7/2001 | Kobayashi et al. | |
| 6,274,442 B1 | 8/2001 | Gardner et al. | |
| 6,284,583 B1 | 9/2001 | Saida et al. | |
| 6,316,354 B1 | 11/2001 | Hu | |
| 6,323,519 B1 | 11/2001 | Gardner et al. | |
| 6,348,380 B1 | 2/2002 | Weimer et al. | |
| 6,380,014 B1 | 4/2002 | Ohta et al. | |
| 6,387,761 B1 | 5/2002 | Shih et al. | |
| 6,420,752 B1 | 7/2002 | Ngo et al. | |
| 6,465,370 B1 | 10/2002 | Schrems et al. | |
| 6,483,172 B1 | 11/2002 | Cote et al. | |
| 6,485,988 B2 | 11/2002 | Ma et al. | |
| 6,544,908 B1 | 4/2003 | Weimer et al. | |
| 6,551,867 B1 | 4/2003 | Ozeki et al. | |
| 6,559,007 B1 * | 5/2003 | Weimer | 438/257 |
| 6,653,222 B2 * | 11/2003 | Murphy | 438/622 |
| 6,815,805 B2 * | 11/2004 | Weimer | 257/629 |

OTHER PUBLICATIONS

Lifshitz et al., *Detection of water–related charge in electronic dielectrics,* Appl. Phys. Lett. vol. 55, Issue 4, Jul. 24, 1989, pp. 408–410.

Momose et al., *Very Lightly Nitrided Oxide Gate Mosfets For Deep–sub–micron CMOS Devices,* IEDM, 1991, pp. 359–362.

Vanheusden et al., *Positive charging of buried SiO2 by hydrogenation,* Appl. Phys. Lett., vol. 64, No. 19, May 9, 1994, pp. 2575–2577.

Vines et al., *Platinum Metals,* Chapter 13 of Characteristics of the Platinum Metals, pp. 342–356.

Sakai et al., *Novel seeding method for the growth of polycrystalline Si films with hemispherical grains,* Appl. Phys. Lett., vol. 61, No. 2, Jul. 13, 1992, pp. 159–161.

*Superconducting RF Cavities: A Primer,* Basics of SRF Cavities 3.1: Fowler–Nordheim Theory, http://www.lns.cornell.edu/upblic/CESR/SRF/BasicSRF/SRFBas31.html, Dec. 9, 1999.

Watanabe et al., *Hemispherical Grained Si Formation on in–situ Phosphorous Doped Amorphous–Si Electode for 256Mb Dram's Capacitor,* IEEE Transactions on Electron Devices, vol. 42, No. 7, Jul. 1995, pp. 1247–1254.

* cited by examiner

US 6,924,197 B2

METHOD OF FABRICATING AN INTEGRATED CIRCUIT WITH A DIELECTRIC LAYER EXPOSED TO A HYDROGEN-BEARING NITROGEN SOURCE

CLAIM OF PRIORITY

This application is a divisional application of, and claims priority from U.S. patent application Ser. No. 09/544,505, filed Apr. 6, 2000 now U.S. Pat. No. 6,559,007, which is incorporated in its entirety by reference herein. This application is related to two divisional U.S. patent applications of U.S. patent application Ser. No. 09/544,505, U.S. patent application Ser. No. 10/378354, filed on Mar. 3, 2003, which is incorporated in its entirety by reference herein, and U.S. patent application Ser. No. 10/378,573, filed Mar. 3, 2003, which is incorporated in its entirety by reference herein.

FIELD OF THE INVENTION

The present invention generally relates to transistor gate dielectrics and methods of fabricating the same. More particularly, the invention relates to processes and structures for improving tunnel oxide quality in erasable programmable read-only memories (EEPROMs).

BACKGROUND OF THE INVENTION

Memory devices such as erasable programmable read-only memories (EPROMs), electrically erasable programmable read-only memories (EEPROMs), or flash erasable programmable read-only memories (FEPROMs) are erasable and reusable memory cells which are used in digital cellular phones, digital cameras, LAN switches, cards for notebook computers, etc. A memory cell operates by storing electric charge (representing an "on" state) on an electrically isolated floating gate, which is incorporated into a transistor. This stored charge affects the behavior of the transistor, thereby providing a way to read the memory element. It is therefore crucial that the memory cell be able to maintain the stored charge over time, so that charge leakage does not cause data errors by converting "on" states to "off."

A memory cell typically consists of a transistor, a floating gate, and a control gate above the floating gate in a stacked gate structure. The floating gate, typically composed of polysilicon, is electrically isolated from the underlying semiconductor substrate by a thin dielectric layer, which is typically formed of silicon oxide. Because charge is transferred across the dielectric layer by quantum-mechanical tunneling, this dielectric layer is often referred to as a "tunnel oxide" layer. Such tunnel oxide layers are typically approximately 100 Å thick. Properties of the tunnel oxide must be strictly controlled to ensure the ability to read and write by tunneling, while avoiding data loss through charge leakage. The control gate is positioned above the floating gate, and is electrically isolated from the floating gate by a storage dielectric layer, such as oxide-nitride-oxide (ONO). Electrical access to the floating gate is therefore only through capacitors.

Storing charge on the floating gate programs a memory cell. This is achieved via hot-electron injection by applying a high positive voltage (approximately 12 V) to the control gate, and a high drain-to-source bias voltage (approximately 6 V). An inversion region is created between the source and drain by the control gate voltage, and electrons are accelerated from the source to the drain by the drain bias voltage. Some fraction of these electrons will have sufficient energy to surmount the tunnel oxide barrier height and reach the floating gate. The floating gate is therefore programmed by collecting and storing these electrons to represent an "on" state.

An EPROM device can be erased (i.e., returned to an "off" state) by exposing the floating gate to ultraviolet light, which excites the stored electrons out of the floating gate. The erasure of an EEPROM or FEPROM cell is accomplished via Fowler-Nordheim tunneling, in which an electric field is sufficient for the stored electrons to traverse the tunnel oxide and enter the substrate, thereby reducing the stored charge in the floating gate. Under this mechanism for discharging the floating gate, a large negative voltage (e.g., $-10$ V) is applied to the control gate, and a positive voltage (e.g., 5–6 V) is applied to the source while the drain is left floating. Electrons then tunnel from the floating gate through the tunnel oxide, and are accelerated into the source. Because both the programming and erasing of a memory element takes place via charge transfer processes across the tunnel oxide layer, it is important to minimize the density of interface states and other defects in the form of charge traps in this region which would otherwise create a mechanism for charge leakage through the tunnel oxide.

Current memory devices have shown improvements in data retention by the formation of a thin oxynitride layer, typically formed by exposure of the thermal oxide to either NO or $N_2O$ at elevated temperatures. The thin nitrided interface improves the tunnel oxide's resistance to the creation of defects by electrons during the write and erase sequence. Another possible method of reducing charge leakage is to remove species such as hydroxyl (OH) from the tunnel oxide prior to final encapsulation. Nitridation also forms a barrier against further degradation by impurity migration. The density of charge trapping sites due to OH in the tunnel oxide region is thereby significantly reduced, resulting in devices with improved data retention and reliability.

Once the stacked gate structure has been fabricated and etched to the appropriate dimensions, the stacked gate structure is encapsulated in a liner layer, followed by the formation of an insulating layer, typically composed of thick, planarized borophosphosilicate glass (BPSG). The liner layer between the source/drain regions and the BPSG, often composed of a low pressure chemical vapor deposition (LPCVD) oxide, serves to minimize out-diffusion of contaminants and dopants from the BPSG. Such out-diffusion might otherwise affect the performance of underlying devices.

Additional improvements in memory device performance have been achieved by performing "alloy" steps later in the fabrication process. In an alloy step, the integrated circuit being fabricated is exposed to hydrogen while being annealed at low temperatures (less than 450° C.). Incorporation of hydrogen is believed to tie up dangling bonds at the tunnel oxide region, thereby eliminating interface states that would otherwise contribute to charge trapping and device degradation. The positive effects of alloy steps are well known in the art. Unfortunately, hydrogen annealing and/or OH exposure at high temperatures can be detrimental to transistor devices. See, e.g., Vanheusden et al., "Positive Charging of Buried $SiO_2$ by Hydrogenation," Appl. Phys. Lett., Vol. 64, No. 19 (May 9, 1994), pp. 2575–77. Typical oxide liners are not effective barriers against $H_2$ or OH. Accordingly, high temperature processing allows mobile OH molecules to diffuse into the tunnel oxide after formation, degrading data retention of the resultant part.

While processes have been developed to improve gate dielectric quality, as measured by improved data retention in flash memory devices, for example, a finite soft error rate remains. Accordingly a need exists for further improvements in the fabrication of transistor gate dielectrics.

SUMMARY OF THE INVENTION

In accordance with one aspect of the present invention, a method is provides for fabricating an integrated circuit. The method includes forming a dielectric layer on a semiconductor surface and exposing the dielectric layer to a hydrogen-bearing nitrogen source. A conductive layer is then deposited directly over the dielectric layer. After patterning to define a gate stack, a conformal insulating liner is formed over the gate stack. The liner incorporates nitrogen.

In accordance with another aspect of the invention, an integrated circuit is provided with a plurality of transistors. Each transistor includes a hydrogen-passivated gate dielectric layer, a stacked gate structure above the gate dielectric layer, and a conformal liner layer covering the stacked gate structure. The liner layer includes nitrogen.

In the illustrated embodiments, a tunnel oxide in an EEPROM device is nitrided with ammonia. Hydrogen is thus incorporated into the tunnel oxide, along with nitrogen. The gate stack is etched and completed, including protective sidewall spacers and dielectric cap, and the stack lined with a silicon nitride or oxynitride.

Advantageously, the liner serves as an excellent diffusion barrier against contamination of the gate stack from hydrogen or OH, particularly protecting the tunnel oxide. While such effective diffusion barriers also inhibit hydrogen diffusion from subsequent alloy steps, meant for occupying dangling bonds at the substrate and tunnel oxide interface, the prior ammonia nitridation compensates for this hydrogen blocking by providing hydrogen to the oxide prior to sealing the gate stack with the liner.

DETAILED DESCRIPTION OF THE PREFERRED EMBODIMENT

While illustrated in the context of an electrically erasable programmable read only memory (EEPROM) device for flash memory circuits, persons skilled in the art will readily find application for the present invention to fabrication of other semiconductor integrated circuit devices. In particular, methods disclosed herein are applicable to improving the gate dielectrics in a wide variety of transistor designs with a wide variety of process flows. The methods described herein, however, have particular utility for improving the performance of tunnel dielectrics.

Figure 1:
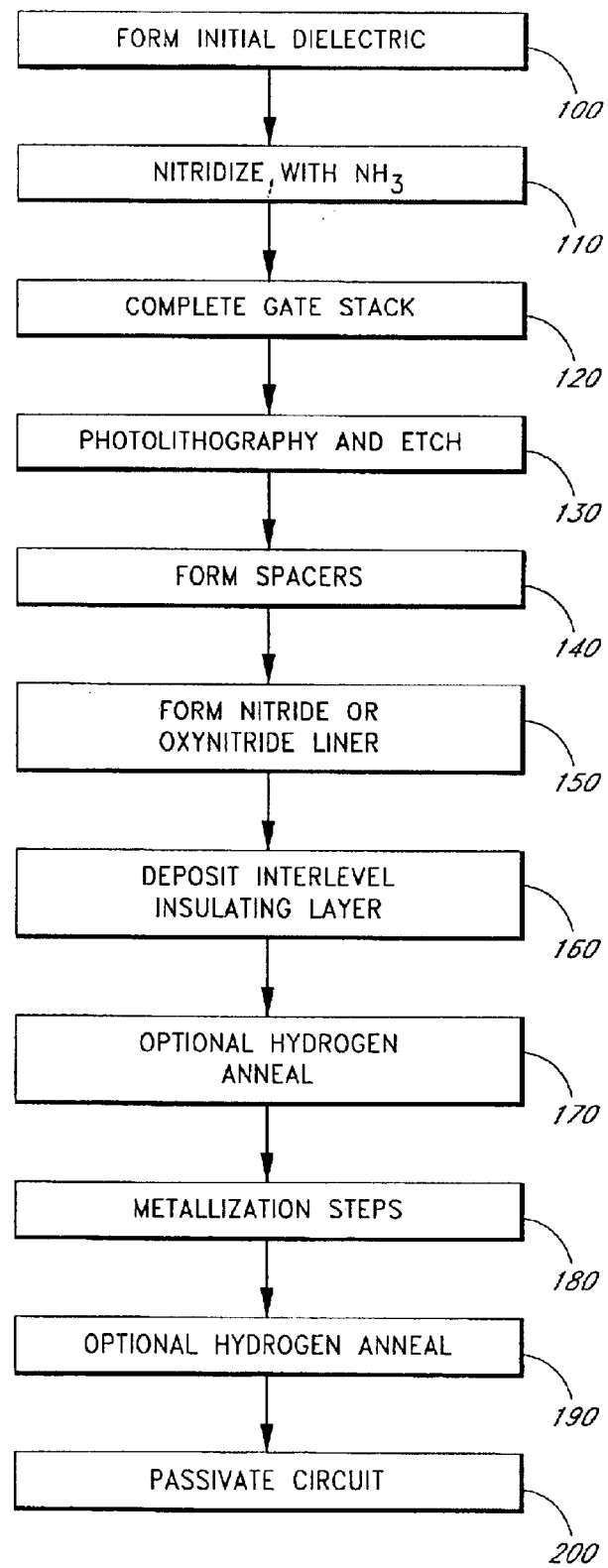
FIG. 1 is a flow chart, generally illustrating a process flow in accordance with a preferred embodiment of the present invention.
Figure 2:
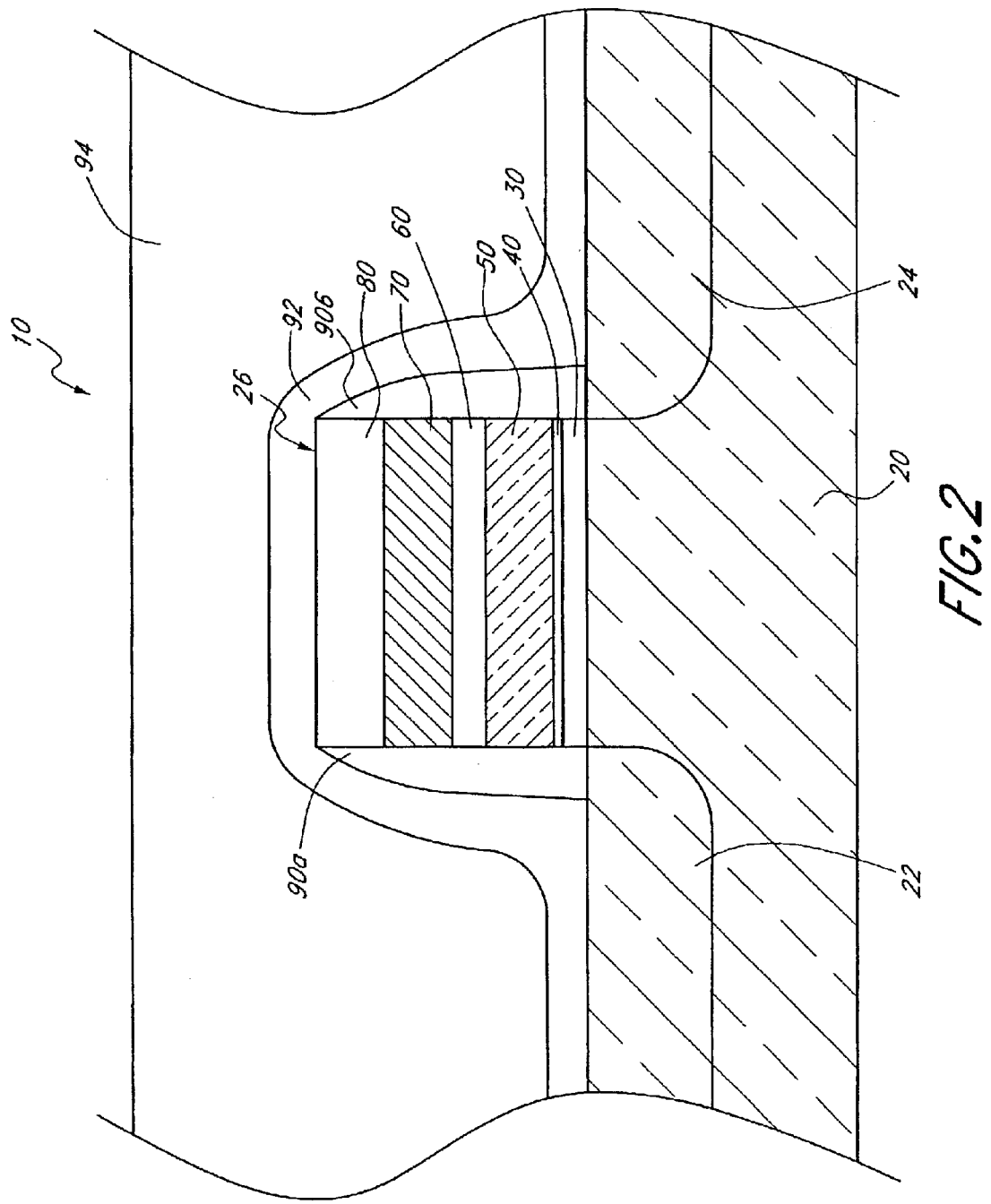
FIG. 2 illustrates a device structure encompassing one preferred embodiment of the present invention.

FIG. 1 is a flow chart which generally illustrates a process flow in accordance with one preferred embodiment of the present invention, and FIG. 2 illustrates an EEPROM transistor 10 in a flash memory cell, constructed in accordance with this preferred embodiment. In the following description of the preferred embodiments, the named process flow steps are found in FIG. 1 and the numbered structural elements refer to FIG. 2. It will be understood, however, that elements may differ in appearance during fabrication as compared to the illustrated final structure. For example, the gate stack layers described below are preferably blanket deposited upon one another prior to definition of the gate electrode by photolithography and etch.

The EEPROM transistor 10 produced by the preferred embodiment of the present invention is fabricated over a semiconductor substrate 20, which includes doped regions corresponding to a source 22 and a drain 24. In the illustrated embodiment, the substrate 20 comprises the upper portion of a single-crystal silicon wafer. In general, however, the substrate can comprises any semiconductor structure or layer in which the lowest level of integrated electrical devices are formed. As shown, a transistor gate structure 26 overlies the substrate 20, particularly over a channel region of the substrate 20 between the source 22 and the drain 24. The active areas 22, 24 and transistor gate 26 together define the EEPROM transistor 10.

In the preferred embodiment of the present invention, the first step in the fabrication of the stacked gate structure 26, as illustrated in FIG. 1, is the formation 110 of an initial dielectric layer 30 on the surface of the substrate 20. The dielectric 30 preferably comprises an oxide, and more particularly silicon oxide, though the skilled artisan will appreciate that the present invention will have utility in conjunction with other types of oxide. An exemplary alternative oxide comprises tantalum pentoxide ($Ta_2O_5$). In the illustrated embodiment, formation 100 of the dielectric 30 comprises thermal oxidation of the substrate surface, but persons skilled in the art are able to select an appropriate method of forming the tunnel dielectric layer 30 from the various possible methods. The thickness of the illustrated dielectric layer 30 is preferably between about 10 Å and 300 Å, more preferably between about 30 Å and 150 Å, and most preferably between about 80 Å and 115 Å (e.g., for a flash memory part).

The next step shown in FIG. 1 comprises nitridation 110 of the the initial dielectric layer 30. At least a top surface 40 thereby incorporates nitrogen and forms and effective diffusion barrier. The amount of nitrogen incorporated into the oxide preferably forms a barrier to diffusion of hydrogen species out of the dielectric. The nitridation 110 can be performed either during the growth or in a subsequent anneal of the initial dielectric layer 30.

In the preferred embodiment of the present invention, the nitridation 110 is performed by exposing the initial dielectric layer 30 to a hydrogen-bearing nitrogen source, particularly ammonia vapor ($NH_3$), while the substrate 20 is held at elevated temperatures. The amount of nitrogen and hydrogen incorporated in the dielectric increases with increasing substrate temperature during exposure to $NH_3$. For example, a substrate temperature between about 850° C. and 950° C. incorporates approximately 2%–3% into the resultant tunnel dielectric 30, 40.

Too little or too much nitrogen and/or hydrogen can adversely affect device performance. Preferably, nitrogen and hydrogen are incorporated without nitrogen- or hydrogen-induced defects. Conditions are arranged to incorporate between about 0.1 atomic % and 5.0 atomic % nitrogen in the tunnel dielectric 30, 40, more preferably between about 0.1 atomic % and 0.6 atomic %, and most preferably between about 0.3 atomic % and 0.6 atomic %. The resultant tunnel dielectric of the illustrated embodiment comprises silicon oxynitride, or $SiO_xN_y$.

In particular, in order to reduce the impact of trap sites created by exposure of oxide to hydrogen at higher temperatures, the substrate temperature is desirably kept below about 850° C. during nitridation 110, more preferably in the range of about 600° C. to 850° C., and most preferably about 650° C. to 750° C. The $NH_3$ exposure during nitridation 110 is preferably maintained for between about 1 second and 60 minutes, more preferably between about 30 seconds and 300 seconds. Exemplary pressure during $NH_3$ nitridation 110, for the most preferred temperature range above, is about 300–760 Torr.

Subsequent to nitridation 110, the layers of the transistor gate stack can be completed 120 in any suitable fashion, typically entailing numerous processing steps. In the illustrated embodiment, a floating gate 50 is formed by depositing a conductive layer (preferably doped polysilicon) onto the tunnel dielectric 30, 40. Doping of the polysilicon of the floating gate 50 can be either in situ (i.e., while the floating gate 50 is being formed) or it can be a separate step after the polysilicon deposition. Persons skilled in the art are able to select appropriate materials and methods for creating the floating gate 50 with a particular set of characteristics.

After the formation of the floating gate 50, the formation of the gate stack continues by forming a storage dielectric layer 60 on the floating gate 50. In the illustrated embodiment, the storage dielectric layer 60 is composed of oxide-nitride-oxide (ONO), formed by methods known in the art. In other arrangements, high dielectric materials can be employed to improve capacitance of the EEPROM device. Persons skilled in the art can readily select appropriate materials and methods for creating the storage dielectric layer 60 for particular circuit designs.

The stack completion 120 continues by then forming a control gate 70 over the storage dielectric layer 60. The control gate 70 can be composed of various conductive materials, including, but not limited to, polysilicon, metal and/or metal silicide. Upon formation of the control gate 70, a cap insulator layer 80 is preferably formed, comprising an insulator such as silicon nitride or silicon oxide, over the control gate 70.

After the completion 120 of the gate stack, the stack is patterned 130, such as by conventional photolithography and etch processes, to define the gate electrode structure 26. In the illustrated embodiment, spacers 90$a$ and 90$b$ are also formed 140 along the sidewalls of the stacked gate structure 26. Conventional blanket deposition of an insulating material followed by directional spacer etch can be employed for spacer formation 140.

In the preferred embodiment of the present invention, as illustrated in FIG. 1, the gate 26 and other surrounding areas are then covered 150 by a substantially conformal liner layer 92. While conventional oxides effectively block dopant diffusion, such as boron and phosphorus from overlying BPSG, the liner 92 of the preferred embodiments also forms a good diffusion barrier against hydroxyl and hydrogen species. The liner 92 comprises an insulating material, preferably incorporating both silicon and nitrogen. Thus, preferred liner materials includes silicon nitride, silicon oxynitride or a multiple layer laminate including one or both of nitride and oxynitride. The skilled artisan will readily appreciate that the invention can comprise any of a number of other suitable materials that form effective barriers to diffusion of OH and hydrogen.

The illustrated liner 92 comprises silicon oxynitride ($Si_xN_yO_z$), where z is in the range of about zero to 0.3 (30 atomic %), more preferably between about 0.1 and 0.2 and y is greater than zero, more preferably between about 0.3 and 0.57 and most preferably between about 0.4 and 0.57. Exemplary ratios include $Si_{0.43}N_{0.57}O_0(Si_3N_4)$, $Si_{0.5}N_{0.4}O_{0.12}$, $Si_{0.45}N_{0.35}O_{02}$, etc.

The liner 92 can be formed 150 by any suitable manner, but is preferably formed by chemical vapor deposition (CVD) to ensure good step coverage over the topography of the patterned gate electrodes 26 across the substrate. CVD processes are well developed for each of $Si_3N_4$ and silicon oxynitride. For example, a silicon source (e.g., $SiH_2Cl_2$), nitrogen source (e.g., $NH_3$) and oxygen source (e.g., $O_2$, $N_2O$) can be reacted in a CVD process. Varying the relative source gas flow or partial pressure can vary the nitrogen content, as will be appreciated by the skilled artisan. Alternatively, CVD oxide can be nitridized, e.g., by remote plasma nitridation, to incorporate 1–40 atomic % nitrogen, more preferably 4–15 atomic %.

Subsequent to forming the liner layer 92 in the preferred embodiment of the present invention, an interlevel insulating layer 94 is deposited 160 over the structure. Typically composed of BPSG, the layer 94 serves to electrically isolate underlying devices, such as the EEPROM transistor 10, from overlying interconnects. Accordingly, the insulating layer 94 is preferably between about 6,000 Å and 20,000 Å in thickness.

After forming the liner, state of the art integrated circuit fabrication typically employs an alloy step 170, in which the structure is exposed to a hydrogen-containing ambient at low temperatures (less than about 500° C.). In the illustrated embodiment, the liner 92 serves as a barrier to OH and H diffusion. As previously noted, such species can cause damage to the tunnel oxide 30 in the form of charge leakage paths. However, hydrogen already incorporated into the tunnel oxide provides passivation of substrate interface. The alloy step 170 is thus only optional, and can be omitted in the preferred embodiments. If an alloy is employed, the liner 92 advantageously prevents OH and other contamination from reaching the tunnel oxide 30.

After depositing 160 the interlayer dielectric layer 110, the integrated circuit is completed by additional fabrication steps. Typically, such steps include metallization processes 180, interconnecting various devices of the integrated circuit. In order to make contact electrical contact between metal layers and the electronic devices, holes or vias are etched through the interlevel dielectric layers between levels, such as the insulating layer 94, and then filled with conductors. Contact to the transistor control gate 70 and active areas in the substrate 20, for example, require contact through the insulating layer 94 and the liner 92.

Optional hydrogen anneals 190 can also be performed during or after metallization to further reduce the dangling bonds at the substrate surface, including the region of the tunnel dielectric layer 30, 40. Diffusion is facilitated somewhat through the contacts. As noted with respect to hydrogen anneal after deposition 160 of the insulating layer 94, hydrogen diffusion can also be enhanced by grinding the backside of the workpiece.

The integrated circuit is then completed by formation of bond pads and final passivation 200, such as by deposition of a further silicon oxynitride layer or other suitable passivation material. As will be appreciated by the skilled artisan, the passivation layer forms a seal against moisture or other corrosive agents.

The use of $NH_3$ during nitridation 110 of the initial dielectric layer 30 advantageously improves the resultant device performance. As will be appreciated by the skilled artisan, nitridation of the tunnel oxide with hydrogen-bearing species enables the use of a more effective diffusion barrier for the liner 92. The more effective liner 92 limits exposure of the tunnel oxide 40 to outgassing of OH and H during subsequent processing, which improves data retention in the resultant chip. Using $NH_3$ also advantageously provides hydrogen atoms within the tunnel dielectric, preferably resulting in a hydrogen content between about 0.1% and 10% in the tunnel oxide. Moreover, this hydrogen is effectively retained within the tunnel dielectric due to the presence of a nitrogen-rich surface on the tunnel dielectric, locking hydrogen in during subsequent processing. The hydrogen is then available at later stages for passivating dangling bonds at the substrate surface and in the region of the tunnel dielectric layer. Because the preferred embodiment of the present invention introduces hydrogen atoms during the formation of the oxynitride layer 40, the efficacy of any subsequent alloying steps is of less importance. Less aggressive hydrogen anneals can be employed. In one embodiment, subsequent hydrogen anneals are eliminated altogether. In another embodiment, only post-metallization hydrogen anneal is employed.

Furthermore, the use of $NH_3$ for nitridation permits the use of a more effective diffusion barrier for the liner layer 100 that protects the transistor gate stack. Whereas very effective diffusion barriers protect the transistor from water or OH contamination during BPSG deposition, for example, they also inhibit desirable hydrogen diffusion. The preferred embodiments, however, provide and seal hydrogen in the tunnel dielectric at an early stage, thereby facilitating use of more effective liner material without sacrificing hydrogen passivation of the tunnel dielectric and substrate interface. In the preferred embodiment of the present invention, the liner layer 100 comprises silicon nitride ($Si_3N_4$) or silicon oxynitride ($SiO_xN_y$). These nitrogen-containing compounds are more effective barriers to OH diffusion than, for example, LPCVD oxide.

Experiments have confirmed the effectiveness of the preferred ammonia rapid thermal anneal (RTA) upon device performance. In the absence of hydrogen alloy annealing, devices formed with ammonia RTA of tunnel oxide performed better than devices formed with longer and more expensive NO anneal of tunnel oxide at 800° C. for 30 minutes, 800° C. for 15 minutes and 850° C. for 30 minutes. In particular, plots of drain current $I_D$ against gate voltage $V_G$ indicate a steeper slope (e.g., by a ratio of 39 to 34–37) for the ammonia anneal. The steeper slope indicates greater carrier mobility in the channel. Accordingly, the ammonia anneal serves not only to harden the tunnel oxide, but also provides hydrogen passivation of dangling bonds at the substrate and gate dielectric interface.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

I claim:

1. A method of fabricating an integrated circuit, comprising:

forming a dielectric layer on a semiconductor surface;

exposing the dielectric layer to a hydrogen-bearing nitrogen source;

depositing a conductive layer directly over the dielectric layer after exposing;

patterning to define a gate stack that includes the conductive layer and the dielectric layer; and forming a conformal insulating liner over the patterned gate stack, the liner comprising a barrier to diffusion of hydrogen and hydroxyl.

2. The method of claim 1, further comprising forming a storage dielectric over the conductive layer and a control gate layer over the storage dielectric prior to patterning.

3. The method of claim 1, wherein the hydrogen-bearing nitrogen source comprises ammonia.

4. The method of claim 1, further comprising forming protective sidewall spacers after patterning and before forming the liner.

5. The method of claim 1, wherein the conformal insulating liner comprises silicon.

6. The method of claim 5, wherein the conformal insulating liner comprises silicon oxynitride.

7. The method of claim 5, wherein the conformal insulating liner comprises silicon nitride.

8. The method of claim 1, wherein the nitrogen content of the dielectric layer after exposing comprises between about 0.1 atomic % and 5.0 atomic %.

9. The method of claim 1, wherein the nitrogen content of the dielectric layer after exposing comprises between about 0.3 atomic % and 0.6 atomic %.

10. The method of claim 1, wherein the dielectric layer comprises a nitrided tunnel oxide in a flash memory device.

11. The method of claim 1, further comprising a hydrogen anneal after forming the conformal insulating layer.

12. The method of claim 1, further comprising, after forming the conformal insulating liner, completing the integrated circuit without hydrogen annealing the workpiece.

13. The method of claim 1, wherein exposing the dielectric layer to a hydrogen-bearing nitrogen source includes maintaining a workpiece temperature of less than about 850° C.

14. The method of claim 1, wherein exposing the dielectric layer to a hydrogen-bearing nitrogen source includes maintaining a workpiece temperature in the range of about 600° C. to 850° C.

15. The method of claim 1, wherein exposing the dielectric layer to a hydrogen-bearing nitrogen source includes maintaining a workpiece temperature in the range of about 650° C. to 750° C.

16. The method of claim 1, wherein the liner comprises $Si_xN_yO_z$, and z is in the range of about 0 to 0.3 and y is greater than zero.

17. The method of claim 16, wherein y is in the range of about 0.4 to 0.57.

18. The method of claim 16, wherein z is between about 0.1 and 0.2.

19. The method of claim 16, wherein the dielectric layer comprises silicon oxide.

20. The method of claim 16, wherein the dielectric layer comprises tantalum pentoxide.

21. The method of claim 16, wherein the dielectric layer is between about 10 Å and 150 Å thick.

22. The method of claim 16, wherein the dielectric layer is between about 80 Å and 115 Å thick.

* * * * *

UNITED STATES PATENT AND TRADEMARK OFFICE
CERTIFICATE OF CORRECTION

PATENT NO. : 6,924,197 B2
DATED : August 2, 2005
INVENTOR(S) : Ronald A. Weimer

It is certified that error appears in the above-identified patent and that said Letters Patent is hereby corrected as shown below:

Column 1,
Line 14, delete "10/378354" and insert -- 10/378,354 --.

Column 4,
Line 35, after "of the," delete "the".

Column 5,
Line 65, delete "$O_{02}$" and insert -- $O_{0.2}$ --.

Signed and Sealed this

Twenty-first Day of February, 2006

JON W. DUDAS
*Director of the United States Patent and Trademark Office*